Figure 1:
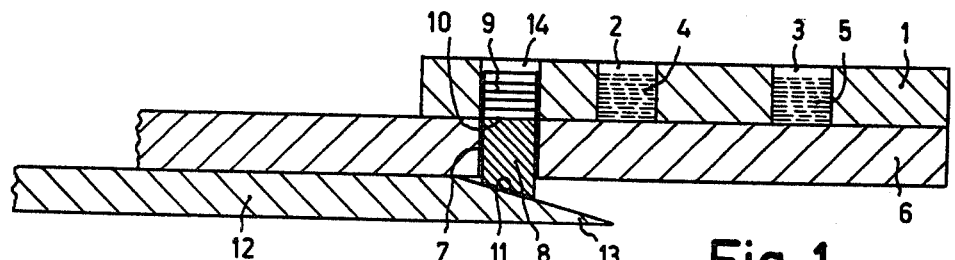

United States Patent [19]

van Oirschot et al.

[11] 4,308,820
[45] Jan. 5, 1982

[54] APPARATUS FOR EPITAXIAL CRYSTAL GROWTH FROM THE LIQUID PHASE

[75] Inventors: Theodorus G. J. van Oirschot; Willem Nijman, both of Eindhoven, Netherlands; Marc P. A. Fougères, Paris, France

[73] Assignee: U.S. Philips Corporation, New York, N.Y.

[21] Appl. No.: 762,429

[22] Filed: Jan. 25, 1977

Related U.S. Application Data

[60] Continuation of Ser. No. 580,185, May 23, 1975, abandoned, which is a division of Ser. No. 464,790, Apr. 29, 1974, Pat. No. 3,940,296.

[30] Foreign Application Priority Data

May 1, 1973 [NL] Netherlands .......................... 7306004

[51] Int. Cl.³ ................................................ B05C 3/18
[52] U.S. Cl. ..................................... 118/412; 118/415
[58] Field of Search ............... 118/415, 422, 500, 319, 118/412; 156/622; 148/171, 172; 23/273 SR

[56] References Cited

U.S. PATENT DOCUMENTS

| 2,516,908 | 8/1950 | Pottle | 118/319 X |
| 2,608,177 | 8/1952 | Powers | 118/DIG. 3 |
| 2,910,041 | 10/1959 | Greenlie | 118/319 X |
| 3,747,562 | 7/1973 | Stone et al. | 148/171 X |
| 3,785,884 | 1/1974 | Lockwood | 156/622 X |
| 3,809,584 | 5/1974 | Akai et al. | 156/622 X |
| 3,821,039 | 6/1974 | Ettenberg | 148/172 X |
| 3,879,235 | 4/1975 | Gatos et al. | 148/171 |

Primary Examiner—John P. McIntosh
Attorney, Agent, or Firm—Paul R. Miller

[57] ABSTRACT

In an arrangement for providing a layer of semiconductor material on a flat side of a substrate from a solution which contains the semiconductor material, the substrate is provided in a recess of a substrate holder which closes the lower side of the reservoir containing the solution. By a relative displacement of the reservoir relative to the substrate holder, the flat side of the substrate is moved below or away from the solution present in the reservoir. The flat side of the substrate is brought to a desired height relative to the lower side of the reservoir, and solution from the reservoir is provided on the substrate. When the reservoir is removed relative to the substrate, a quantity of solution at an adjustable height is left on the substrate.

5 Claims, 12 Drawing Figures

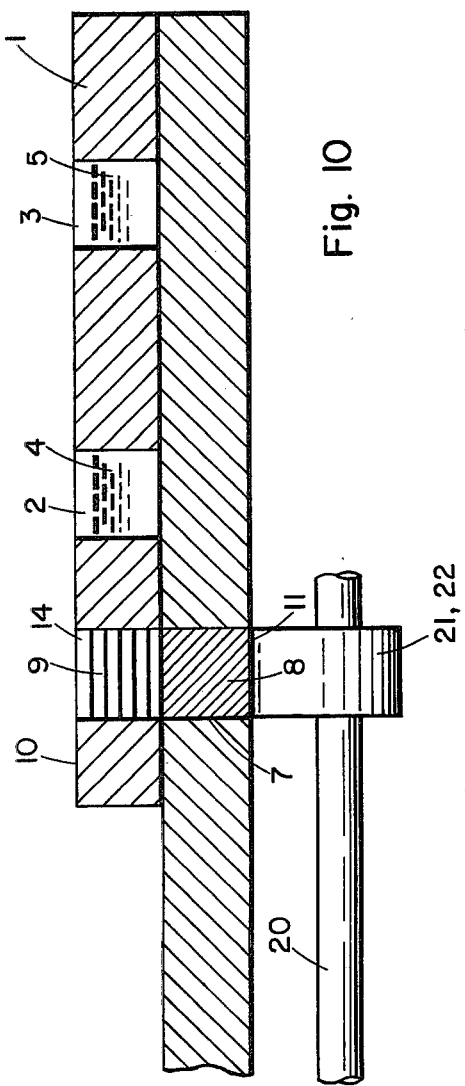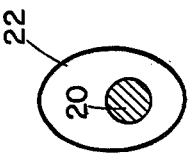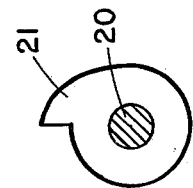

APPARATUS FOR EPITAXIAL CRYSTAL GROWTH FROM THE LIQUID PHASE

This is a continuation of Ser. No. 580,185 filed May 23, 1975, now abandoned, which was a divisional of Ser. No. 464,790 filed Apr. 29, 1974 now U.S. Pat. No. 3,940,296.

The invention relates to a structure for providing a layer of a semiconductor material on a flat side of a substrate from a solution which contains the semiconductor material, in which the substrate is provided in a recess of a substrate holder which closes the lower side of a reservoir containing the solution and in which flat side of the substrate can be moved below or away from the solution present in the reservoir by a relative displacement of the reservoir relative to the substrate holder. The substrate will usually be monocrystalline.

Both the epitaxial growing from the liquid phase of one layer and of several layers of the group III-V semiconductor materials is known. Examples of such a use are found inter alia in the manufacture of light emitting diodes, of injection lasers, of solar cells and of transmission photocathodes. The grown layers usually consist of GaAs, GaP and $Al_xGa_{1-x}As$.

One of the known methods of epitaxial growth from the liquid phase is described in the U.S. Pat. No. 3,690,965. In this method, a reservoir which is open on its lower side is closed by an upper slide which is movable along the lower side of the reservoir. The upper slide comprises a continuous aperture of approximately the same dimensions as the lower aperture of the reservoir. A lower slide is situated against the upper slide so as to be movable and comprises a number of locations for substrates and a number of recesses for receiving the solution used. The epitaxial growth preferably takes place from solution present in the aperture of the slide, the height of the solution present on the substrate being approximately equal to the thickness of the upper slide. After the growth of a layer, the solution used is provided in the recess of the lower slide destined for that purpose.

Such a known method exhibits drawbacks. When the grown layer has reached the desired thickness, the upper slide with the solution still present is moved away from the substrate, it being desired that all the excessive solution be removed from the substrate. If, however, too large an amount of play is present between the upper side of the grown layer and the lower side of the slide in which the solution is present, no complete removal of the excessive solution will take place. The thickness of the grown layer is not fully fixed in that case while, when several layers are grown one after the other, an undesired mixing will occur of the solution still present on the substrate and a solution of a different composition in a subsequent reservoir. However, it is also possible that in the case of too small an amount of play the substrate with the grown layer cannot be removed from below the slide in which the melt is present or cannot be removed without damage.

It is the object of the invention to provide a structure in which an epitaxial growing of one or more layers can be carried out in a very favourable manner and in which drawbacks of the known methods are avoided. In order to achieve this end, acccording to the invention the flat side of the substrate is brought at a desired height with respect to the lower side of the reservoir, solution from the reservoir is provided on the substrate, and a quantity of solution of an adjustable height is left on the substrate when the reservoir is removed relative to the substrate.

Important advantages can be achieved due to the variable height adjustment which is controllable both prior to, during and after the growth process. In the first place, the distance from the upper side of the grown layer on the substrate to the lower side of the reservoir can be adjusted so as to be optimum so that excessive solution can be removed from the substrate entirely. Damage to the substrate is prevented and the friction between the upper side of the substrate and the edge of the reservoir is small. Furthermore, the variable height adjustment may also be used so as to provide a quantity of solution of a controllable height above the reservoir which is very favourable for the growth of the epitaxial layer. After the growth of the layer, the excessive solution can be returned to the original reservoir by means of the height adjustment so that no solution is lost.

The desired height between the substrate and the reservoir is preferably obtained during the treatment in an epitaxy furnace by means of an adjustment from outside the furnace.

The variable height adjustment permits the growth of the layer to be carried out in various manners. In a first embodiment, the layer is provided on the substrate by cooling the solution in the position in which the substrate is present below the reservoir, the height of the substrate to the lower side of the reservoir, at least upon removing the reservoir relative to the substrate, being substantially equal to the thickness of the grown layer. However, it is also possible to provide the layer on the substrate by cooling a quantity of solution which is adjusted in height and is present on the substrate in a position in which the reservoir is removed from the substrate, in which after providing the layer the substrate is again provided below the reservoir and adjusted at such a height that in a subsequent removal of the reservoir relative to the substrate all the excessive solution remains in the reservoir. A very favourable growth process can be achieved in particular with this latter method.

Due to the variable height adjustment the arrangement according to the invention is particularly suitable for epitaxially providing several layers on the substrate in which the substrate, after providing the first layer, is moved below subsequent reservoirs each containing a solution of the desired composition, a height adjustment of the substrate relative to the lower side of the relevant reservoir being each time carried out.

The invention furthermore relates to a device for epitaxially providing a layer of semiconductor material on a flat side of a substrate, which device comprises a slide mechanism which has a reservoir holder and a substrate holder, the reservoir holder having at least one aperture for a solution which contains the semiconductor material and the substrate holder having at least one recess in which a substrate can be arranged. A favourable device for carrying out the invention is characterized in that a support for the substrate is provided in the recess of the substrate holder so as to be adjustable in the height direction, the upper surface of the support serving as a location for the substrate and the lower side of the support being in contact with an adjusting member with which the substrate support is adjustable in the height direction relative to the lower side of the reservoir.

It is advantageous and at a high operating temperature extremely favourable for the adjusting member to consist of a slide which is movable relative to the substrate support and which has a wedge-like surface which contacts the lower side of the support. A further embodiment is characterized in that the adjusting member consists of a rod which cannot be moved relative to the substrate support and which is rotatable about its longitudinal axis, said rod comprising a cam or an eccentric circular disk which contacts the lower side of the support.

Due to the height adjustment, the device is not only favourable for growing epitaxial layers, but the device may also be used in a simple manner for the supply and removal of the substrates. The device may also comprise a compartment arranged in the reservoir holder and serving to supply substrates, which compartment is closed on the lower side by the substrate holder, in which a substrate in the recess of the substrate holder can be pick up by means of the support which is adjustable in the height direction. A transport member for the treated substrates may furthermore be present and be movable towards one end of the substrate holder, the placing of the treated substrate on the transport member being carried out by means of a height adjustment of the support and a relative displacement of the substrate holder and the reservoir holder.

Figure 2:
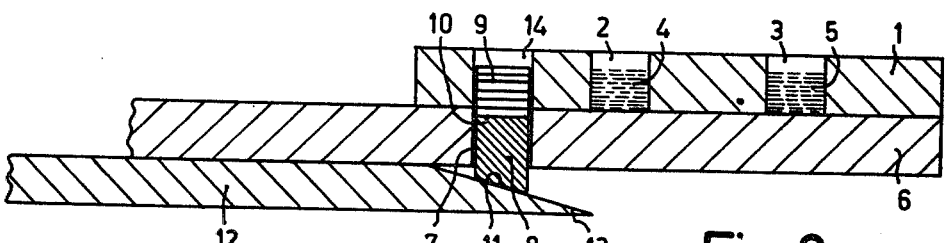
Figure 3:
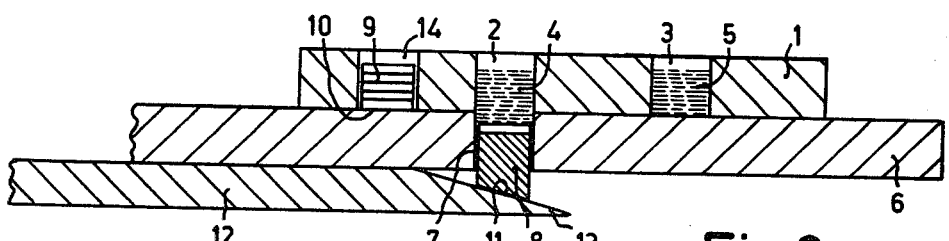
Figure 4:
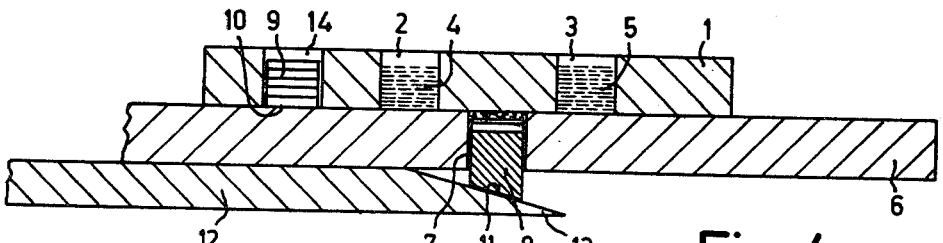
Figure 5:
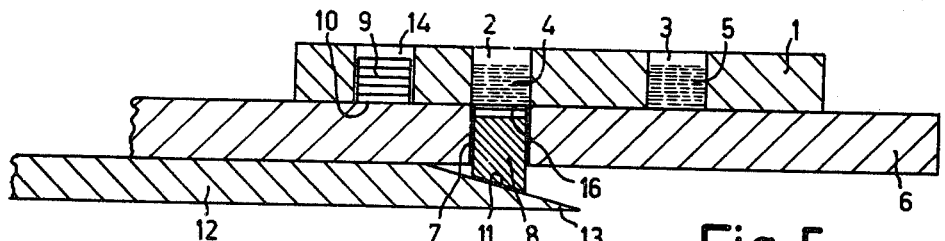
Figure 6:
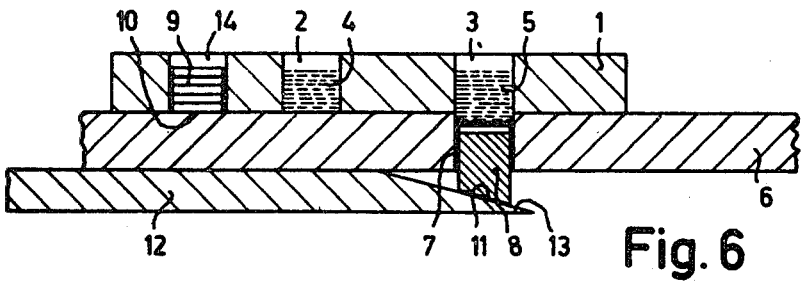
Figure 7:
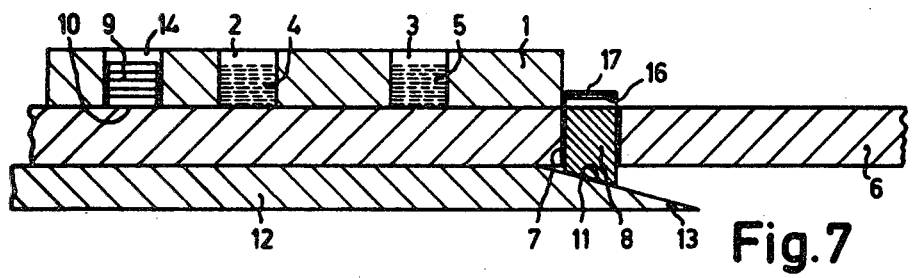
Figure 8:
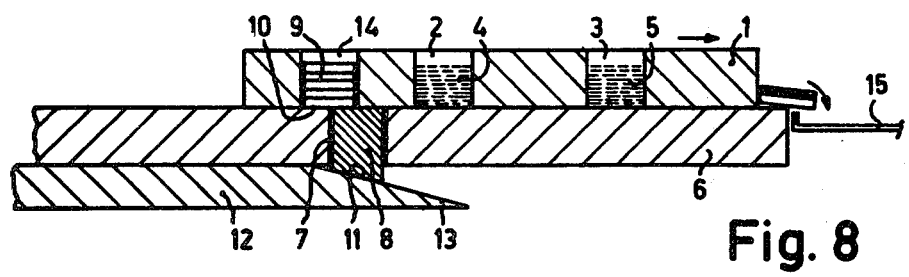
Figure 9:
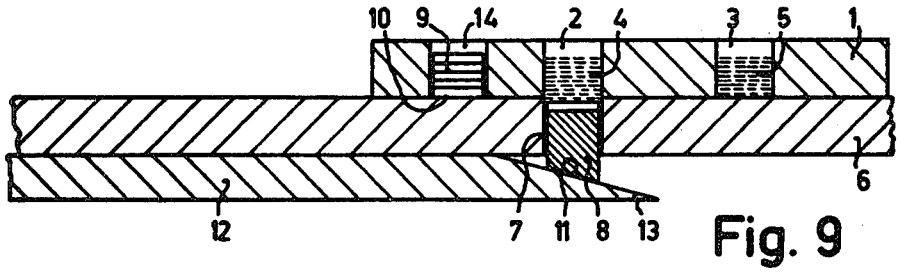

The invention will be described in greater detail with reference to embodiments shown in the drawing figures, in which FIG. 1 shows an initial stage of the present invention, FIG. 2 shows a subsequent stage of the invention where a substrate is placed in the substrate holder, FIG. 3 shows a subsequent stage of the invention where a substrate is located under a solution reservoir, FIG. 4 shows a subsequent stage of the invention where a substrate is moved to an offsetting position, FIG. 5 shows a subsequent stage of the invention where the substrate is moved back to the solution reservoir, FIG. 6 shows a subsequent stage of the invention where another layer is formed on the substrate, FIG. 7 shows a subsequent stage of the invention where the grown substrate is moved outside of the reservoir holder, FIG. 8 shows a subsequent stage of the invention where the grown substrate is removed, FIG. 9 shows an alternative arrangement of the present invention, FIG. 10 shows another embodiment of the invention, and FIGS. 11A and 11B show alternative arrangements in the embodiment of FIG. 10.

In the figures, a reservoir holder is denoted by 1. In the embodiment shown, a reservoir holder comprises two reservoirs 2, 3 which each contain a solution 4, 5. A substrate holder 6 which together with the reservoir holder 1 constitutes a slide mechanism closes the lower side of the reservoirs 2, 3. The substrate holder 6 comprises a continuous aperture 7 in which a support 8 for a substrate 9 is provided so as to be adjustable. The upper side of the support 8 serves as a location 10 for a substrate 9; in the embodiment shown the lower side 11 is bevelled. An adjusting member 12 is movable relative to the substrate holder 6. The adjusting member is wedge-shaped at 13 and is in contact with the lower side 11 of the support 8.

The reservoir holder 1 may also comprise a compartment 14 in which substrates 9 to be treated are stored. A transport member 15 for the treated substrates is shown diagrammatically in FIG. 8. The transport member can be moved away from and towards one end of the substrate holder 6 through means not shown.

Both the reservoir holder 1, the substrate holder 6, the support 8 and the adjusting member 12 are preferably made from pure graphite. They are placed in a tube furnace, for example of quartz, which is not shown to avoid complexity of the drawing. By way of example, in the embodiment shown the substrate holder 6 is maintained stationary while the reservoir holder 1 and the adjusting member 12 are adjustable from outside the tube furnace. The tube furnace may be heated by means of heating members not shown, for example, in the form of heating coils arranged outside the tube furnace.

The growing of one or more layers on a substrate may be carried out in the manner to be described hereinafter. The reservoir holder 1 and the adjusting member 12 are first provided in the position shown in FIG. 1, after which the adjusting member which has a wedge 13 is moved over such a distance that the substrate support 8 is lowered over a distance equal to the thickness of a substrate 9 so that one substrate is supplied to the holder 6 (FIG. 2). When the reservoir holder 1 is then moved, the substrate 9 is moved below the reservoir 2 in which the solution 4 is present. Movement of the adjusting member 12 lowers the support 8 over such a distance that a quantity of solution having a desired height is present in the substrate holder 6 as is shown in FIG. 3. With this height adjustment the substrate is moved to the position shown in FIG. 4, for which purpose the reservoir holder is moved in this embodiment. A quantity of solution of accurately adjusted height is now present above the substrate. In the position which the substrate assumes in FIG. 4 a temperature is adjusted which produces crystallisation of semiconductor materials present in the solution on the substrate so that a layer 16 is grown epitaxially on the substrate 9 from the solution. This growth process has proved excellently reproducible with a given height of the solution, for example, less than 3 mm.

When the layer 16 has the desired thickness, the reservoir holder 1 is moved until the substrate is again situated below the reservoir 2. By means of the adjusting member a height adjustment of the support 8 is then carried out, in which the upper side of the layer 16 is brought at a level which is substantially equal to the lower side of the reservoir holder (FIG. 5). Excessive solution is again returned to the reservoir 2. This height adjustment can be carried out in a useful manner by causing an edge of the substrate to project below the reservoir holder, the correct height adjustment being obtained when the edge contacts the lower side of the reservoir holder. From this position, the substrate is moved below the reservoir 3 by displacing the reservoir holder. All the excessive solution remains in the reservoir 2 due to the height adjustment of the substrate; in this manner no solution is lost while no contamination of the solution 5 in the reservoir 3 can take place by mixing with solution from reservoir 2.

In the same manner as described with reference to the epitaxial growth of layer 16 from solution 4, a second layer from the solution 5 may now be grown on the layer 16. A stage of this process is shown in FIG. 6, namely the height adjustment of the substrate occurs corresponding to FIG. 3. When the second layer has been provided and the excessive solution has been returned entirely to reservoir 3, the substrate may be transported away. This may be carried out, for example, as is shown in FIGS. 7 and 8 in which the substrate is first moved upwards outside the reservoir holder (FIG. 7) and then placed on the transporting member 15 by a relative movement of the substrate holder 6 and the reservoir holder 2 (FIG. 8). The support 8 is then present again below compartment 14 where a new substrate may be provided.

FIG. 9 shows that the growth of the layer or layers need not necessarily be carried out in the position shown in FIG. 4, but that it may also be carried out when the substrate is present below a reservoir. As shown in FIG. 9, for example, the substrate 9 may have such a height adjustment that its upper surface is present at a distance below the reservoir holder which is only very slightly larger than the thickness of the layer to be grown. When the temperature of the solution is decreased, epitaxial growth of a layer on the substrate occurs. When the desired thickness of the layer is reached, all the excessive solution is removed from the formed layer by moving the reservoir holder and is taken up in the reservoir.

In the embodiments described, a reservoir holder having two reservoirs is shown. Of course it is also possible to grow only one or more than two layers epitaxially in which one and more than two containers, respectively, having each a given solution will be used. The supply and transport of the substrates may be carried out in the above-described manner but may also be carried out in any other suitable manner. The height adjustment of the substrates is not restricted to the use of an adjusting member having a wedgelike part. For example in FIGS. 10 and 11, an adjusting member 20 consists of a rod which cannot be moved relative to substrate support 6 and which is rotatable about its longitudinal axis, and may have a cam 21 or a circular eccentric disk 22 which engages the lower side of the substrate support 8. The adjusting member 20 then does not move in an axial direction relative to the substrate holder 6. Rotation of the adjusting member 20 produces that the cam 21 or the eccentric disk 22 moves the support 8 for the substrate 9 more or less upwards or downwards. Of course other adjusting possibilities may be used. It is furthermore possible that the reservoir holder and the substrate holder do not move axially relative to each other but that they are constructed to be circular and make a rotational movement relative to each other. The height adjustment of the support for a substrate may structurally become simplest when the substrate holder is chosen to be stationary and the reservoir holder makes a rotating movement so as to obtain the mutual displacement.

The possibility exists that, for example, due to ridge-shaped accretions along the edges of the substrate not all the solution is removed from a layer in spite of the height adjustment. This can be mitigated in a simple manner. The substrate may be provided below an empty reservoir or outside the reservoir holder. As a result of the surface tension, the very thin layer of solution still present will contract spherically after which it can be removed easily. Furthermore, due to the controllable height adjustment, the possibility is presented to mix a solution in a reservoir with a solution in another reservoir if this should be desired. The mixing ratio may then be checked accurately by the controllable height adjustment.

By using the device shown in FIGS. 1 to 9, which was constructed from very pure graphite a number of plates consisting of two or more layers were manufactured as will be described in the following examples.

EXAMPLE I

A plate of monocrystalline galliumphosphide in the (III) orientation and having dimensions $20 \times 12 \times 0.3$ mm$^3$ was used as substrate 9. The solution 4 consisted of 8 of gallium as a solvent, aluminium in a quantity of 0.4% of weight of the solvent gallium, and 3.5% by weight of gallium arsenide so that the solution was saturated at approximately 860° C. The solution 4 furthermore contained a quantity of germanium of 5% by weight as an impurity so as to produce a p-type doping. The solution 5 contained gallium as a solvent (8 g) and 3.5% by weight of gallium arsenide so as to obtain a solution which was just saturated at 765° C. This solution furthermore contained 3% by weight of germanium calculated on the solvent gallium so as to produce a p-type doping of approximately $7 \times 10^{18}$ cm$^3$.

After placing this in a quartz tube furnace, the latter was evacuated and rapidly heated from approximately 20° C. to approximately 890° C. while leading through a flow of purified hydrogen. After homogenizing the solutions at 890° C. the temperature of the tube furnace with its contents was reduced and stabilized at 860° C. With the upper side of substrate 9 at 1 mm below the lower side of the reservoir holder, the reservoir holder 1 was moved in such manner that the substrate contacted the solution 4 (see FIG. 3). The solution with underneath it the substrate was first cooled in this position at a rate of 0.3° C./min for approximately 20 minutes; the substrate, still in its lowered position, together with a small part of the solution 4 was then moved to a place between the reservoirs 2 and 3 as shown in FIG. 4. Substrate and solution were further cooled in this location at a rate of 2° C. per minute, as a result of which a first epitaxial layer of monocrystalline p-type $Al_xGa_{1-x}As$ with germanium as an acceptor was formed having a thickness of 20 μm. At a temperature of 765° C. the cooling rate was reduced to approximately 1° C./minute. When a temperature of 760° C. was reached, the reservoir holder was returned to the position shown in FIG. 5 relative to the substrate but with an edge of the substrate slightly below the reservoir holder. The substrate 9 was then moved upwards via a displacement of the adjusting member 12 and the substrate support 8 until a slight touch between the grown layer 16 and the reservoir holder was observed. The reservoir holder was then moved in such manner that the substrate was displaced relatively in the direction of the reservoir 3, during which treatment the solution 4 was entirely separated from the layer 16. The above-described procedure was then repeated for the greater part for the growth of a second epitaxial layer 17 on the first epitaxial layer of $Al_1Ga_{1-x}As$, on the understanding that the growth took place only over a small temperature range of approximately 3° C. and directly from the whole solution volume, so in the position of FIG. 6. The second grown layer 17 which was 2 μm thick contained germanium doped p-type gallium arsenide having a charge carrier concentration of approximately $7 \times 10^{18}$ cm$^3$.

Of the first epitaxial layer of $Al_xGa_{1-x}As$ thus formed, x is approximately 0.8, so that, as of the gallium phosphide substrate, the forbidden band is much wider than that of the thin second epitaxial layer of gallium arsenide. Relative to the gallium arsenide top layer, both layers form a kind of window which is permeable to light in the infrared and red part of the spectrum. After activating the gallium arsenide surface to the condition of negative electron affinity, the whole plate may be used as a very efficient infrared-sensitive gallium arsenide transmission photocathode.

EXAMPLE II

In this case the reservoir holder 1 had three reservoirs, each containing a different solution. A plate of monocrystalline (100) oriented p-type gallium arsenide was used as a substrate 9. The solutions contained per gramme of the solvent gallium:
0.14 g of gallium arsenide and 0.8 g of tin;
0.06 of gallium arsenide and 0.02 g of germanium;
0.05 g of gallium arsenide, 0.06 g of germanium and 0.001 g of aluminium, respectively.
These solutions are saturated approximately at temperatures of 828° C., 824° C. and 822° C., respectively. The above-described arrangement was operated in a similar manner to example I, with the exceptions that the solutions and the substrate were preheated at approximately 850° C. and were cooled from 828° C. at a rate of approximately 0.2° C. per minute. Epitaxial layers consisting of: Ga As:Sn ($n \simeq 2 \times 10^{18}$ cm$^3$), Ga As:Ge ($p \simeq 4 \times 10^{18}$) and $Al_xGa_{1-x}As$: Ge($X \simeq 0.3$) were thus grown on the substrate 9 from the solutions.

The resulting plate radiated laser light when the plate was used in a semiconductor laser of the Fabry-Perot type.

It will be obvious from the above description and examples that the device according to the invention is capable of avoiding an undesired mixing between the adjacent solutions and removing the last solution entirely from the substrate. It is advantageous that the successful peformance of the various treatments outside the furnace can simply be checked and that certain treatments can be repeated, if desired. The use of empty compartments in the wipe-off procedure may furthermore present advantages.

What is claimed is:

1. A device for providing an epitaxial semiconductor material layer on a substrate, comprising a slide mechanism that comprises a reservoir holder and a substrate holder, said reservoir holder comprising at least one aperture for holding a solution which contains said semiconductor material and said substrate holder having at least one recess that extends completely therethrough and in which a substrate can be provided, an adjusting member slidably related to said substrate holder, a support element disposed in said recess of said substrate holder so as to support said substrate and permit the height adjustment thereof with respect to said aperture, said support element comprising an upper surface at which said substrate is located and a lower side that contacts said adjusting member and being adjustable in the height direction, with which support element said substrate support can be adjusted in the height direction relative to the lower side of said reservoir, said adjusting member and said support element co-acting to permit such a substrate located in the recess of the substrate holder to be removed from said recess and carried away by said support to said at least one aperture holding said solution.

2. A device as in claim 1, wherein said adjusting member comprises a wedge-shaped surface which contacts the lower side of said support.

3. A device as in claim 1, wherein said reservoir holder comprises a compartment for holding such substrates, said compartment being closed on the lower side thereof by said substrate holder.

4. A device as in claim 1, comprising a transport member that can be moved towards one end of the substrate holder for receiving and carrying away treated said substrates on which a semiconductor layer is provided, said treated substrate being disposed on said transport member by adjusting the height of said support element and displacing at least one of said substrate holder and said reservoir holder with respect to the other.

5. A device for providing an epitaxial semiconductor material layer on a substrate, comprising a slide mechanism that comprises a reservoir holder and a substrate holder, said reservoir holder comprising at least one aperture for holding a solution which contains said semiconductor material and said substrate holder having at least one recess that extends completely therethrough and in which a substrate can be provided, an adjusting member, a support element disposed in said recess of said substrate holder so as to support said substrate and permit the height adjustment thereof with respect to said aperture, said support element comprising an upper surface at which said substrate is located and a lower side that contacts said adjusting member with which said substrate support can be adjusted in the height direction relative to the lower side of said reservoir holder, said adjusting member consisting of a rod that is laterally immobile relative to said substrate support element and is rotatable about longitudinal axis, said rod comprising one of a cam and an eccentric circular disk which contacts the lower side of said support element, whereby such a substrate in the recess of said substrate holder can be removed therefrom and carried away by said support element which is adjustable in the height direction.

* * * * *